(12) United States Patent
Kim et al.

(10) Patent No.: US 12,154,861 B2
(45) Date of Patent: Nov. 26, 2024

(54) FRAME DESIGN IN EMBEDDED DIE PACKAGE

(71) Applicant: Texas Instruments Incorporated, Dallas, TX (US)

(72) Inventors: Woochan Kim, Sunnyvale, CA (US); Masamitsu Matasuura, Beppu (JP); Mutsumi Masumoto, Beppu (JP); Kengo Aoya, Beppu (JP); Hau Thanh Nguyen, San Jose, CA (US); Vivek Kishorechand Arora, San Jose, CA (US); Anindya Poddar, Sunnyvale, CA (US); Hideaki Matsunaga, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 765 days.

(21) Appl. No.: 16/669,666

(22) Filed: Oct. 31, 2019

(65) Prior Publication Data

US 2021/0134729 A1 May 6, 2021

(51) Int. Cl.
| | |
|---|---|
| *H01L 23/538* | (2006.01) |
| *H01L 21/48* | (2006.01) |
| *H01L 21/56* | (2006.01) |
| *H01L 23/00* | (2006.01) |
| *H01L 23/31* | (2006.01) |

(52) U.S. Cl.
CPC ...... *H01L 23/5389* (2013.01); *H01L 21/4853* (2013.01); *H01L 21/565* (2013.01); *H01L 21/568* (2013.01); *H01L 23/3107* (2013.01); *H01L 23/5386* (2013.01); *H01L 24/19* (2013.01); *H01L 24/20* (2013.01); *H01L 2224/214* (2013.01); *H01L 2924/10272* (2013.01); *H01L 2924/1033* (2013.01)

(58) Field of Classification Search
CPC ............. H01L 23/5389; H01L 21/4853; H01L 23/3107; H01L 23/5386; H01L 21/565; H01L 24/19; H01L 24/20; H01L 2924/10272; H01L 2224/214; H01L 2924/1033; H01L 23/28–3192; H01L 21/56–568; H01L 2924/181–186; H10K 19/901

See application file for complete search history.

(56) References Cited

U.S. PATENT DOCUMENTS

| | | | | |
|---|---|---|---|---|
| 2010/0019359 | A1* | 1/2010 | Pagaila | H01L 21/568 257/659 |
| 2010/0301474 | A1* | 12/2010 | Yang | H01L 24/29 257/737 |
| 2018/0170050 | A1* | 6/2018 | Chen | B41J 2/14145 |
| 2018/0226367 | A1* | 8/2018 | Babcock | H04B 1/0475 |
| 2020/0258830 | A1* | 8/2020 | Palm | H01L 24/96 |

FOREIGN PATENT DOCUMENTS

EP 3288076 A1 * 2/2018 ............. H01L 24/96

* cited by examiner

*Primary Examiner* — Shahed Ahmed
(74) *Attorney, Agent, or Firm* — Dawn Jos; Frank D. Cimino

(57) ABSTRACT

In one example, embedded die package, including a layer having an exposed boundary, wherein at least a portion of the exposed boundary comprises organic material. The package also includes at least one integrated circuit die positioned in the layer and within the exposed boundary. The package also includes a dielectric material positioned in the layer and between the at least one integrated circuit and structure adjacent the at least one integrated circuit.

23 Claims, 11 Drawing Sheets

FRAME DESIGN IN EMBEDDED DIE PACKAGE

BACKGROUND

The example embodiments relate to embedded die packaging, and in particular to improving various attributes thereof.

Integrated circuit packaging is typically the final stage of semiconductor device fabrication, in which one or more integrated circuit die are encapsulated into a unitary structure, typically referred to as the package. Various types of packaging have evolved, with a more recent approach, particularly suitable for reduced-size applications, being embedded die packaging. As the term embedded connotes, this packaging includes one or more integrated circuit die, and possible related components, within a multilayered (or laminate) substrate. Other components, such as passive devices, may be affixed to the outside of the package. Early substrates in this technology were formed from materials akin to those used in printed circuit boards (PCB), and accordingly, the substrates were sometimes referred to as PCBs. More recently, the layers into which components are embedded are referred to as substrates, without the PCB connotation. The die (or "chip") is typically positioned in a core material within the substrate, and one or more layers or materials, such as metals or organics, are filled in, formed, and/or positioned adjacent both major surfaces (e.g., upper and lower) of the die, completing the substrate with the die embedded therein. Where multiple die are embedded, they are typically side-by-side, rather than stacked, typically facilitating small form factors, reliable interconnection, and high performance.

Embedded die packaging continues to evolve, but in current forms has shown structural vulnerability. For example, in multiple die packages, an applied load at or between the die may cause a bending force and establish a physical breaking point in the substrate, at a point near or between the die. The breaking point can disturb interconnectivity or other structural or electrically-functional aspects of the package, reducing yield, increasing costs, and jeopardizing system functionality.

Example embodiments are provided herein that improve certain of the above concepts, as further detailed below.

SUMMARY

In one example, there is an embedded die package. The package includes a layer having an exposed boundary, wherein at least a portion of the exposed boundary comprises organic material. The package also includes at least one integrated circuit die positioned in the layer and within the exposed boundary. The package also includes a dielectric material positioned in the layer and between the at least one integrated circuit and structure adjacent the at least one integrated circuit.

Other embodiments and aspects are also described and claimed.

DETAILED DESCRIPTION

Figure 1:
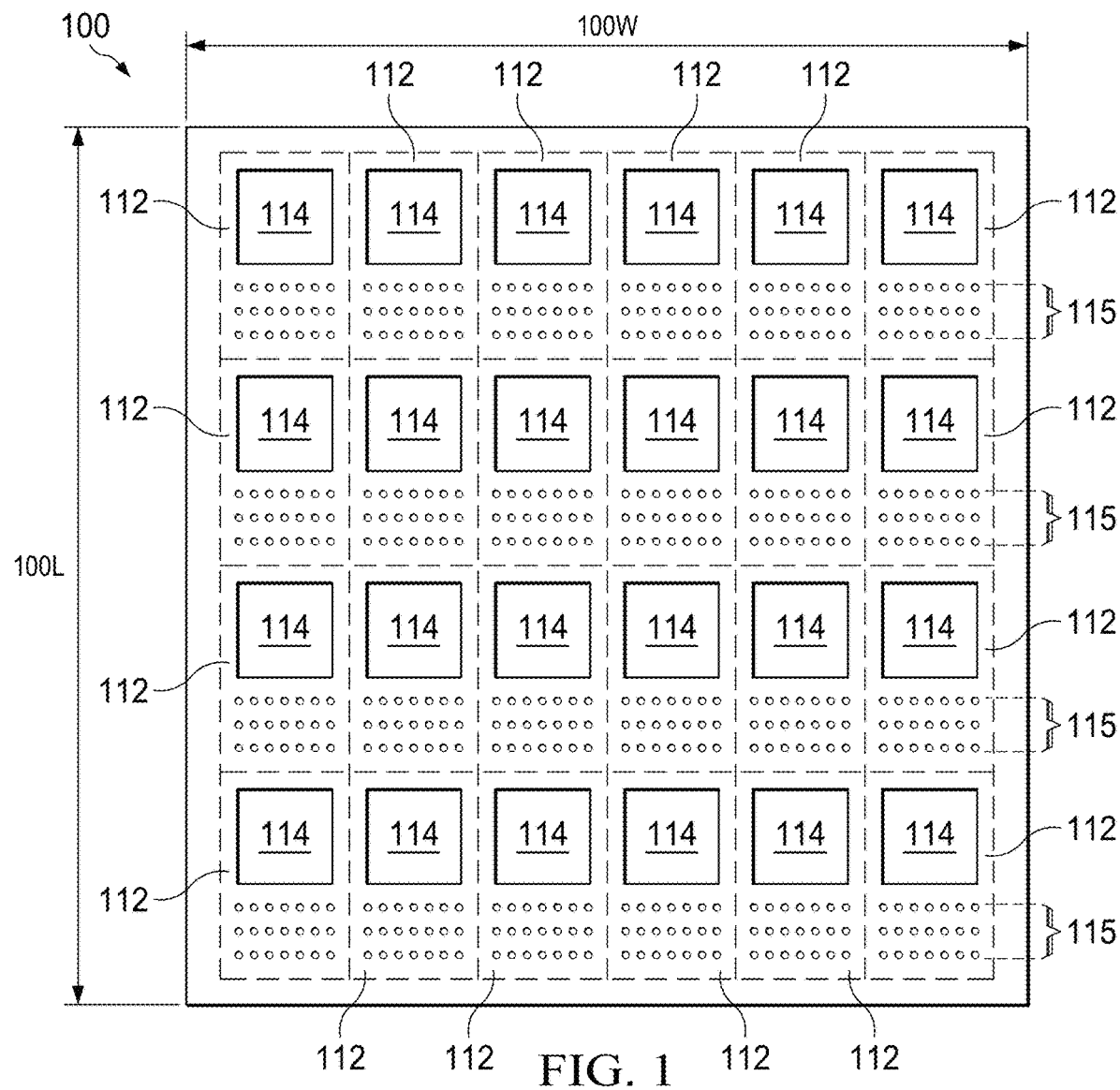
FIG. 1 illustrates a die package frame before package singulation.
Figure 3A:
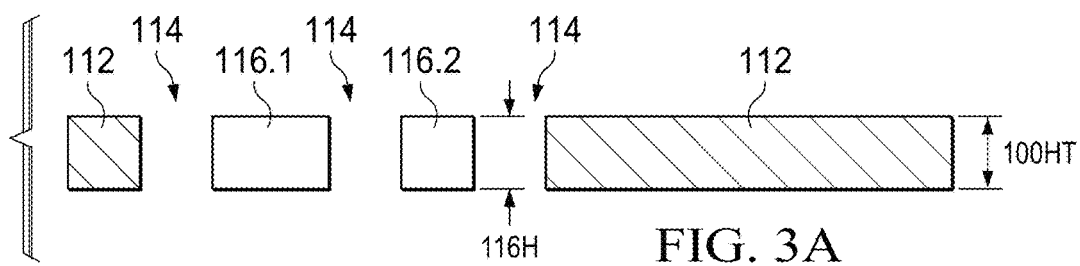
FIGS. 3A through 3C shows respective cross-sectional views from FIG. 2.

FIG. 1 illustrates a plan view of an embedded die package frame 100. In an example embodiment, frame 100 is formed of, or includes, an organic material, such as FR-4. Frame 100 includes a number of identical regions 112, shown separated in FIG. 1 by dashed lines. The dashed lines indicate approximately where each region 112 may be eventually separated from frame 100. For example, the entirety of frame 100 may be embedded as a substrate plane with one or more integrated circuit die positioned per each region 112, as detailed below. At some point thereafter, and with additional layers formed relative to frame 100, singulation, such as by cutting, is performed along or nearby the locations of the FIG. 1 illustrated dashed lines, after which each separate region 112 is associated with a respective integrated circuit package. The example of FIG. 1 provides regions 112 in a row/column orientation, with four rows and six columns of regions 112. Further, frame 100 has outer length 100L and width 100W dimensions to accommodate the total number of regions 112 and in consideration of other manufacturing processes. Typical outer dimensions contemplated for both length 100L and width 100W are between 500 mm and 400 mm. Frame height 100HT is intended the be the third dimension perpendicular to length and width shown in FIG. 1, that is, the dimension into the page of FIG. 1, and is also shown in FIG. 3A. In an example embodiment, the frame height 100HT is greater than the height of the integrated circuit die to be used in conjunction with frame 100. For example, a contemplated range of the frame height 100HT is between 100 µm and 200 µm. Lastly, an aperture 114 is formed in and through each region 112, where the shape of aperture 114 may vary, such as square or rectangular. Each aperture 114 may be formed by a mechanical cutting within the outer perimeter of frame 100, and per each region 112.

In each region 112, aperture 114 provides a cavity or through-hole in which one or more integrated circuit die may be positioned, while the remaining (e.g., organic) material of the region 112 provides structural support for the eventual singulated integrated circuit package that will include region 112 and its associated integrated circuit die. To ensure even filling of the dielectric material, aperture 114 is no more than 30 percent of the total area of region 112. Lastly, each region 112 includes a number (e.g., 21 shown) of additional circular holes 115 to provide lamination process control, that is, as frame 100 is later encapsulated with a material (e.g., a dielectric), holes 115 help to ensure even fill of that material over frame 100.

Figure 2:
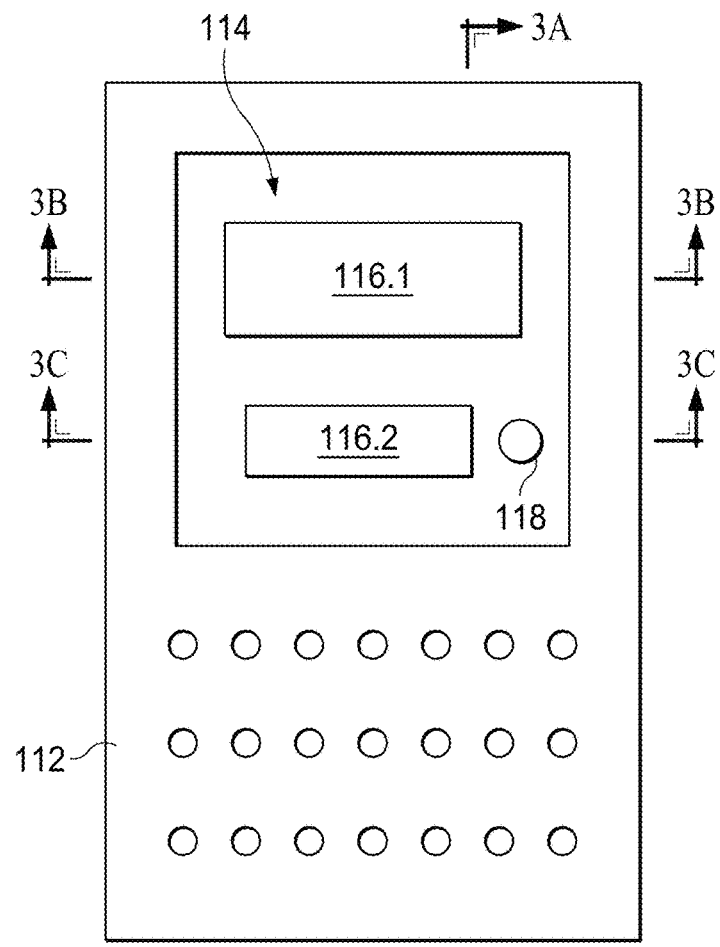
FIG. 2 illustrates a plan view of a single region from the frame of FIG. 1.

FIG. 2 illustrates a plan view of a single region 112, shown separated from frame 100 of FIG. 1, and with additional attributes as will be described. FIG. 2 shows only a single region 112 for illustration simplification, with it understood that each region 112 in frame 100 may be similarly and concurrently configured as shown in FIG. 2, and with later processing steps including additional materials added thereto, then singulating each region 112 from frame 100. In FIG. 2, one or more, with an example of two, integrated circuit die 116.1 and 116.2, are positioned within aperture 114. As detailed below, the positioning of die 116.1 and 116.2 is retained, in part, within the inner boundary that is provided by region 112 around aperture 114, by other materials including those associated with the embedded die packaging. In an example embodiment, a conductive member 118 is also positioned within aperture 114. Conductive member 118 is pre-formed prior to the layering of the embedded die substrate, for example by manufacture of a cylindrical or other desirably-shaped post from a conductive material, such as copper. A number of such copper conductive members 118 may be created and placed on a feed system, such as or akin to tape-and-reel systems known in the integrated circuit manufacturing art. In such an implementation, appropriate packaging apparatus may pick one conductive member 118 at a time from the reel and position it within an aperture 114 of a respective region 112. Pick and placement also may be used for positioning each die 116.1 and 116.2 within a respective aperture 114.

Figure 3B:
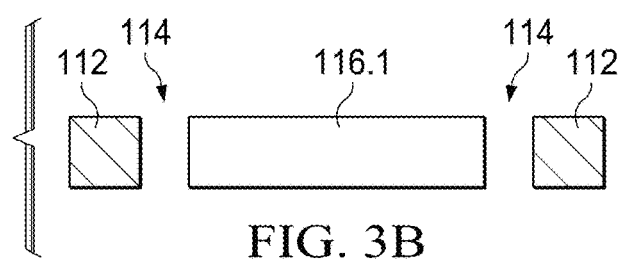
Figure 3C:
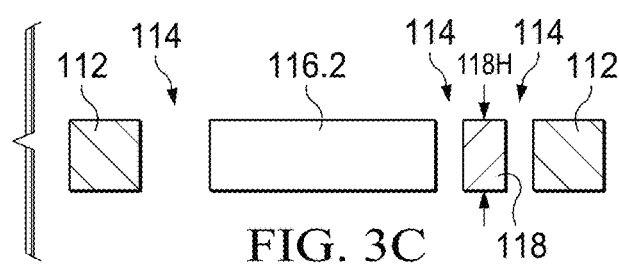

FIGS. 3A through 3C show respective cross-sectional views taken from FIG. 2. The cross-sectional views demonstrate that, in an example embodiment, the height 116H of integrated circuit die 116.1 and 116.2 is approximately the same as, or can be slightly smaller or larger than, the height 100HT of frame 100, which height in the cross-sectional view of FIG. 3A through 3C is shown in the vertical dimension of height 116H. Such relative heights help to control frame/package warpage and helps process control. Additionally, the height 118H of conductive member 118 is approximately the same as the height 100HT of region 112. As shown below, these relative heights facilitate positioning of additional layers relative to frame 100, its regions 112, and the components within each aperture 114.

Figure 4A:
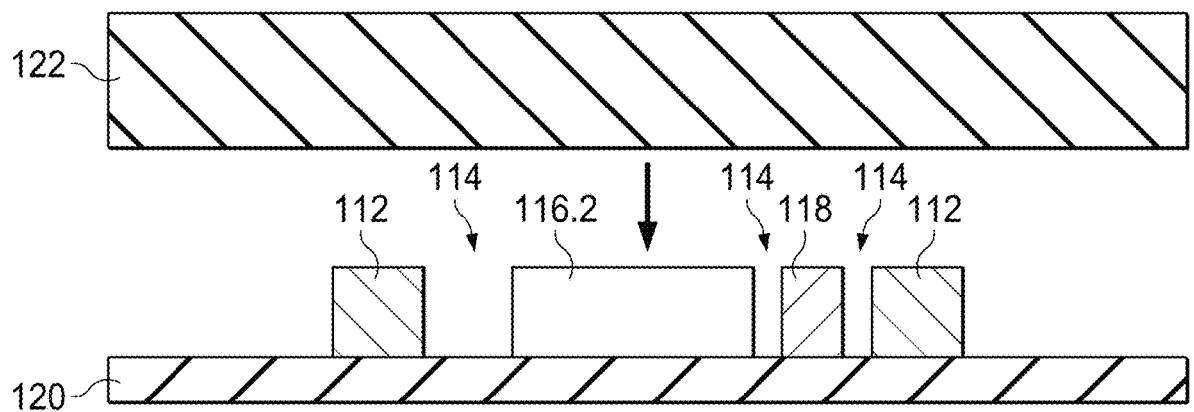
FIG. 4A illustrates a cross-sectional view of FIG. 3C after additional integrated circuit packaging processing.

FIG. 4A illustrates a cross-sectional view of FIG. 3C after additional integrated circuit packaging processing. The additional structures in FIG. 4A are intended to demonstrate that region 112, and the integrated circuit die (e.g., 16.1, 16.2) and conductive member 118 within the respective aperture 114, are embedded in a multiple layer stack. In embedded die technology, sometimes each referenced "layer" is one that includes metal, whereas non-metal sections generally parallel to the metal layers are often merely referred to by material, rather than as a layer per se. The prior art may form each metal layer, as well as vias and other vertical conductors to connect between one side of an integrated circuit die and the other, by plating. The plating process can be very time consuming, particularly with respect to a relatively tall vertical conductor, as compared to that of a typical metal layer. In contrast, at least as far as conductive member 118 is provided, it is not provided by a lengthy plating step, but instead by pre-forming the device as described above.

Figure 4B:
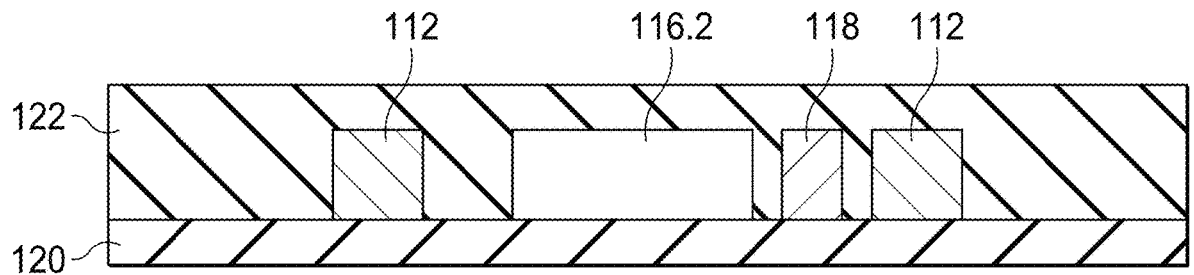
FIG. 4B illustrates FIG. 4A after additional integrated circuit packaging processing.

In the present document, for sake of describing the multiple sections of an embedded die package, the term layer is used to refer to items that are generally coplanar along a stack of items in the embedded die package, meaning at least in part those items would align linearly along a cross-section of the package, and that section being generally parallel to other layers of the package. Looking then at the example in FIG. 4A, each of the FIG. 3C structures are positioned atop a dielectric layer 120, sometimes referred to as build-up, depending on how the dielectric layer is formed. Note that prior to the formation of dielectric layer 120, each of the FIG. 3C structures may be previously positioned by affixing them to an adhesive tape strip, which can then be replaced with dielectric layer 120. Next, an additional dielectric layer 122, such as air-brown-fiber, is heated and brought downwardly in contact with the remaining structure of FIG. 4A. The heat causes layer 122 to soften, to a jelly-like consistency, in which case it fills any voids between components, such as in the areas of aperture 114 that are not occupied by either die or material from region 112, with the result generally as shown in FIG. 4B. FIG. 4B, therefore, illustrates the cross-sectional view of FIG. 4A after layer 122 is heated and applied to the items of FIG. 4A. Accordingly, FIG. 4B illustrates that a respective void is filled with dielectric layer 122, as between: (i) region 112 and die 116.2; (ii) die 116.2 and conductive member 118; and (iii) conductive member 118 and region 112. Thus, the dielectric material provides support between die 116.2 and structure adjacent it, including as to the outer boundary around aperture 114, as provided by region 112.

Figure 4C:
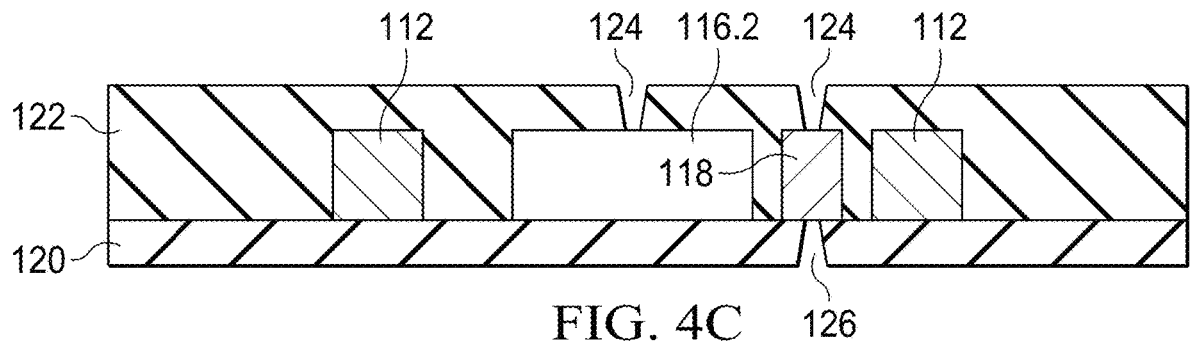
FIGS. 4C and 4D illustrate respective sequential cross-sectional views after additional integrated circuit packaging processing of FIG. 4B.
Figure 4D:
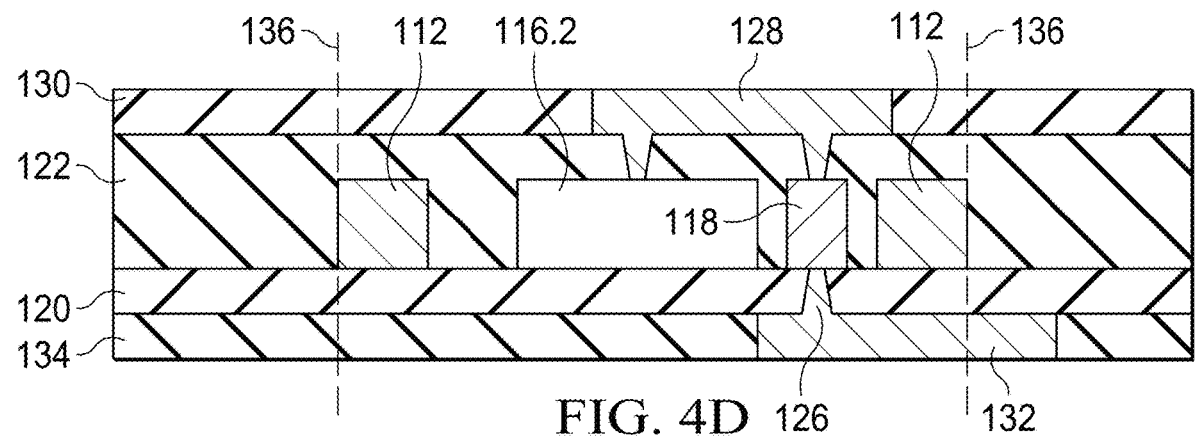

FIGS. 4C and 4D illustrate respective sequential cross-sectional views after additional integrated circuit packaging processing of FIG. 4B, as examples of how additional layers can be formed in an embedded die package. The examples also illustrates how additional layers relate to the above-described devices, which include the positioning of die 116 and a conductive member 118 within a frame aperture 114. Beyond these aspects, the particular additional items are shown by way of example, while various other connections and apparatus may be included or substituted for the examples shown.

In FIG. 4C, vias 124 are formed, for example through an exposed surface of layer 122, such as by forming holes (which may be tapered) in the layer, and through layer 122 to contact points of items to which electrical contact is desired. As examples, vias 124 are shown through layer 122 to what is depicted as the top of both die 116.2 and conductive member 118. Similarly, one or more vias 126 may be formed, for example through an exposed surface of layer 120, again by forming holes (which may be tapered) in the layer, and through layer 120 to contact points of items to which electrical contact is desired. As an example, a via 126 is shown through layer 120 to what is depicted as the bottom of conductive member 118.

FIG. 4D illustrates additional processing following FIG. 4C, and in FIG. 4D a metal layer 128 is patterned above layer 122. Metal layer 128 fills the holes of vias 124 (FIG. 4C) and provides a conductive path between metal layer 128 and any conductor (e.g., die 116.2 and conductive member 118) that is contacted by vias 124. Further, a portion of metal layer 128 remains generally planar above layer 122. Additionally, a filler layer 130 (e.g., dielectric) also may be formed coplanar with metal layer 128, so as to planarize a top surface of the structure. Similar metal conduction paths may be formed on the exposed surface of layer 120, show as the bottom surface in FIG. 4D. In this regard, a metal layer 132 is patterned to fill the hole of via 126 (FIG. 4C), and a portion of metal layer 132 remains generally planar and adjacent layer 120, while the metal-filled via 126 provides a conductive path between layer 132 and any conductor that is contacted by via 128. Additionally, a filler layer 134 (e.g., dielectric) also may be formed coplanar with metal layer 132, so as to planarize a bottom surface of the structure.

Additional layers may be added to those shown in FIG. 4D, providing planarization and conductive paths to other points in the package. Thus, each layer in the package is generally parallel to a plane in which the integrated circuit die is positioned, where the layer includes at least one of dielectrics and conductors. Further, since FIG. 4D illustrates only die 116.2, meanwhile comparable connectivity may be had with respect to die 116.1, either to die 116.2, conductive member 118, or otherwise within the package. Final layers also are completed, including manners of electrically connecting outside the package, as known in the art. For example, solder mask or the like may be used to provide pads or a comparable conductive structure, so that the package may be connected by other manners (e.g., ball grid array) to other electrical componentry. Completing FIG. 4D, dashed singulation lines 136 are shown to illustrate where, once all layers are complete, cuts may be made relative to the illustration, so as to singulate the FIG. 4D layers (and any added layers thereto) into a separate integrated circuit package. With such cutting and separation, some or all of the outer, exposed boundary of the resulting singulated package will comprise region 112 aligned generally in a layer of the package. Accordingly with such singulation, portions of region 112, originating from frame 100, thereby remain as part of a layer in the separate integrated circuit package, providing additional structural rigidity, thereby improving on the prior art. Also in that layer, dielectric material 122 will exist in various voids, as described above.

FIGS. 4E through 4H illustrate respective sequential cross-sectional views of an alternative processing of the integrated circuit packaging of FIG. 4B, as another example of how additional layers can be formed in an embedded die package. The examples also illustrate how additional layers relate to the above-described devices, which include the positioning of die 116 and a conductive member 118 within a frame aperture 114.

Figure 4E:
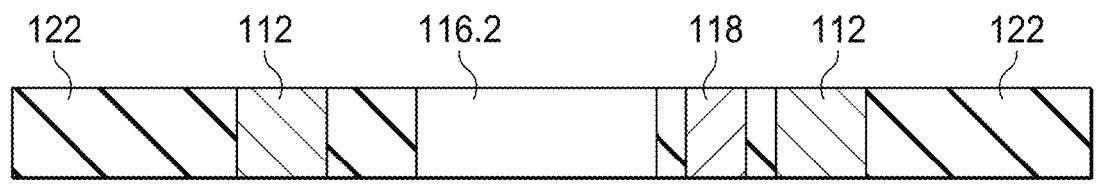
FIGS. 4E through 4H illustrate respective sequential cross-sectional views of an alternative processing of the integrated circuit packaging of FIG. 4B.

In FIG. 4E, the upper surface of the assembly is planarized, thereby planarizing layer 122 and die/frame, for example by plasma or mechanical grinding. Similarly, the lower surface of the assembly is planarized, essentially removing layer 120 (see FIG. 4C for layer 120). Next, a thin film seed layer 140 is formed on the top of the device and a thin film seed layer 142 is formed on the bottom of the device. Layers 140 and 142 are seeds for additional conductor plating, so the material is selected to support a subsequent metal plating. For example, layers 140 and 142 may comprise electroless copper.

Figure 4F:
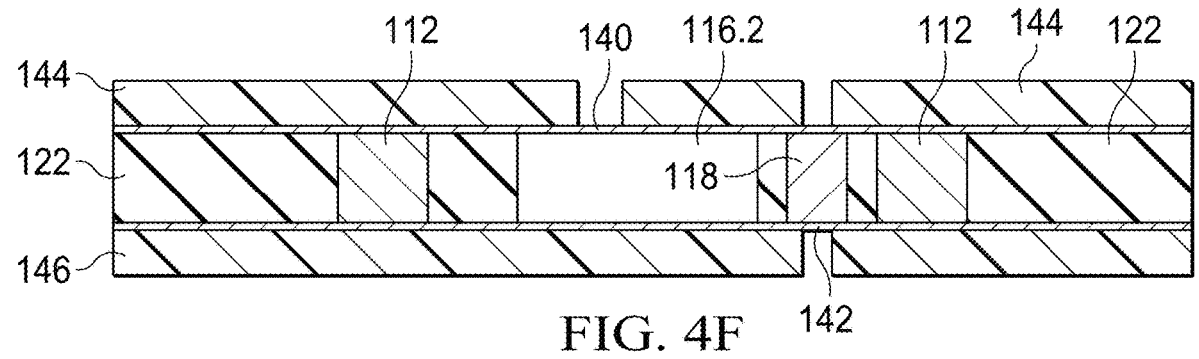

In FIG. 4F, a reverse mask 144 is formed over layer 140 and a reverse mask 146 over layer 142. Reverse masks 144 and 146 are formed in areas where ultimately the plated conductor is not desired, conversely therefore leaving exposed areas where plating is desired.

Figure 4G:
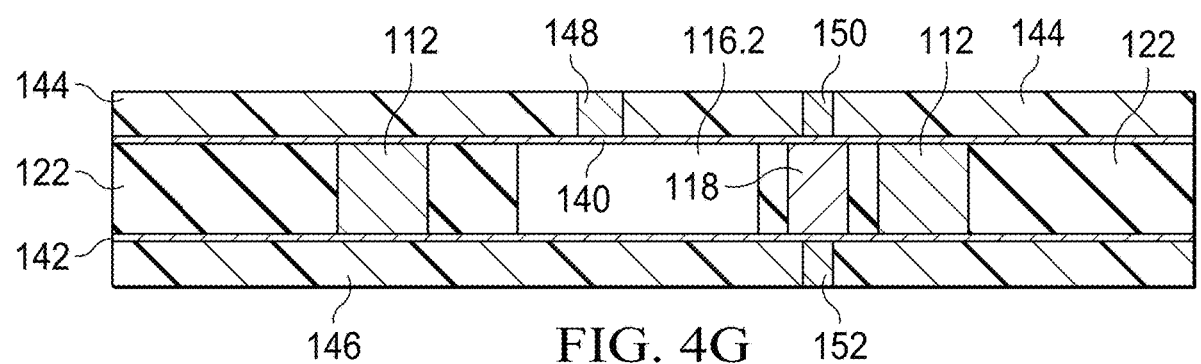

In FIG. 4G, metal plating is added to the unmasked (exposed) areas of layers 140 and 142, that is, in the openings of reverse masks 144 and 146. Accordingly, the metal plating creates metal conductive regions 148, 150, and 152. The height of the metal plating can be as selected by one skilled in the art.

Figure 4H:
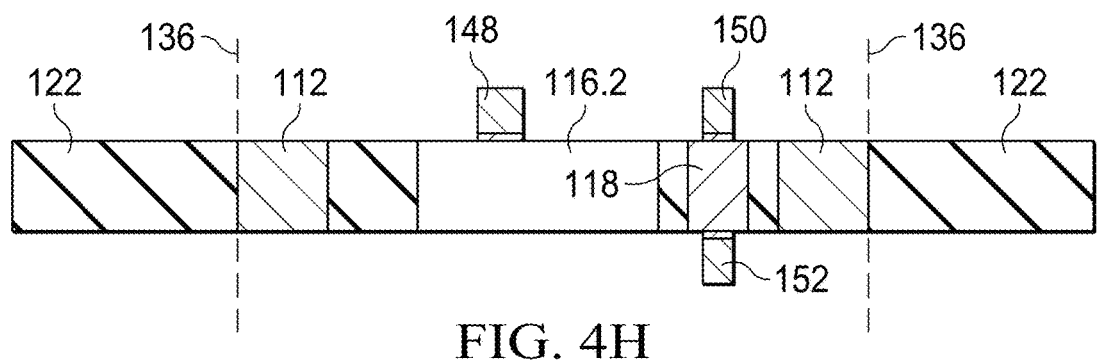

In FIG. 4H, reverse masks 144 and 146 are removed, and an etch to include the non-metal covered portion of seed layers 140 and 142 is performed, thereby removing them and leaving in place metal conductive regions 150, 152, and 154 (the etch can minimally affect other materials, but is not shown for sake of simplification). While not shown, filler layers also may be formed on both the upper and lower surfaces of layer 122, thereby approximately aligning with metal conductive regions 148, 150, and 152. Completing FIG. 4H, again dashed singulation lines 136 are shown to illustrate where, once all layers are complete, cuts may be made relative to the illustration, so as to singulate the FIG. 4H layers (and any added layers thereto) into a separate integrated circuit package. Again, therefore, the cutting and separation creates a singulated package having a layer which includes at least a partial (if not full) outer boundary of exposed portion of region 112, and portions of region 112 also remain in the separate integrated circuit package. Also in that layer, dielectric material 122 will exist in various voids, as described above.

Figure 5:
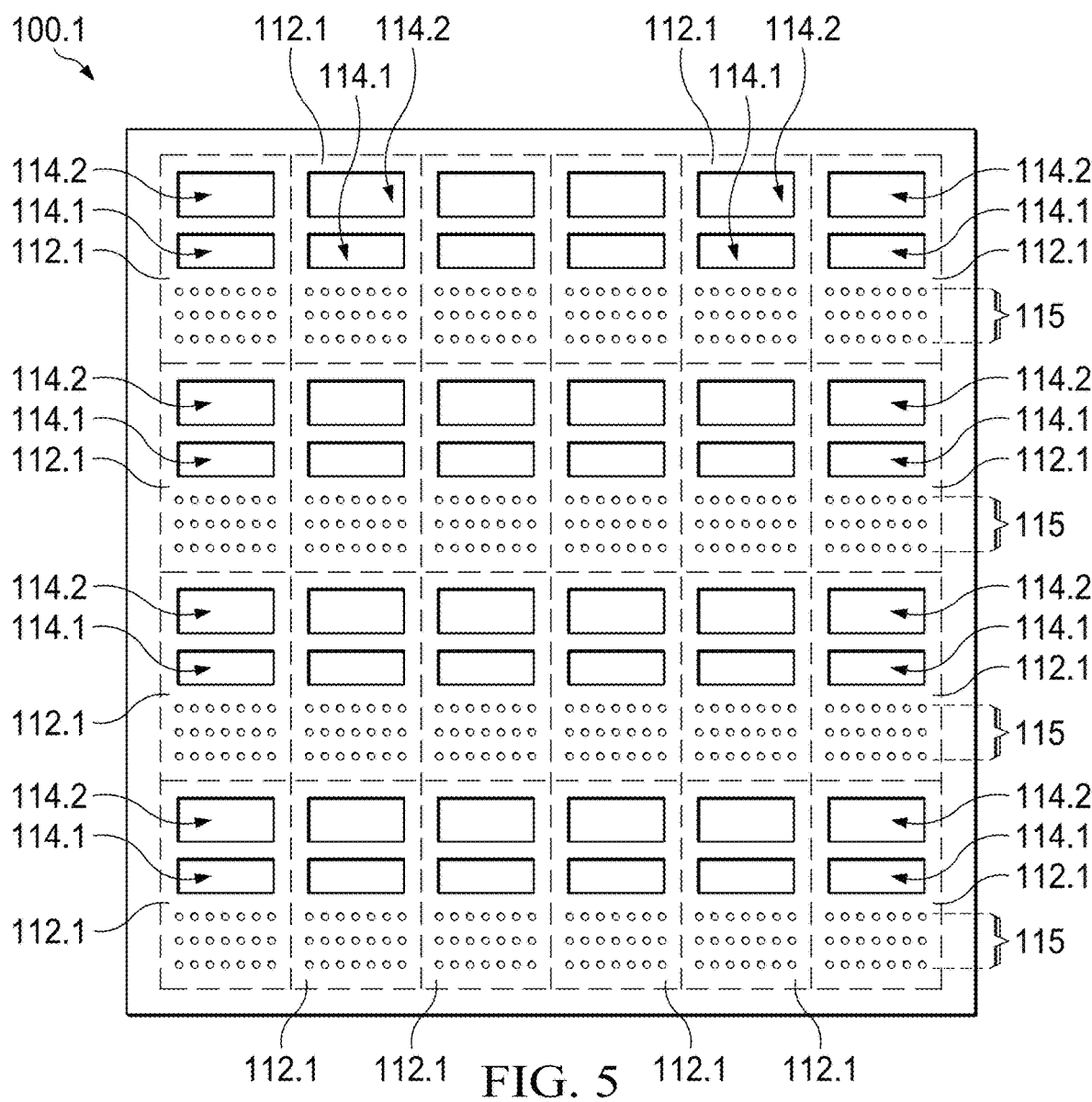
FIG. 5 illustrates a plan view of an alternative embedded die package frame.

FIG. 5 illustrates a plan view of an alternative embedded die package frame 100.1. Frame 100.1 in general may have the same dimensions and materials as frame 100 of FIG. 1. Where frame 100.1 differs, is that each of its (to be singulated) regions 112.1 has two different apertures 114.1 and 114.2, as opposed to the singular aperture 114 of frame 100 of FIG. 1. Each of apertures 114.1 and 114.2 may have the same dimensions, or one of those apertures may be larger than the other. For example, outer dimensions of each aperture 114.1 and 114.2 may be in the range of 6 mm by 2 mm to 6 mm by 4 mm. Each aperture 114.1 and 114.2 may be formed by a mechanical cutting of frame 100.1, and each aperture 114.1 and 114.2 provides a cavity in which one or more integrated circuit die may be positioned, while the remaining (e.g., organic) material of region 112.1 provides structural support for the eventual singulated integrated circuit package that will include region 112.1 and its associated integrated circuit die. For preserving such structural support, of the total area of a region 112.1, the total cavity area provided by apertures 114.1 and 114.2 is no more than 30 percent of the entire area.

Figure 6:
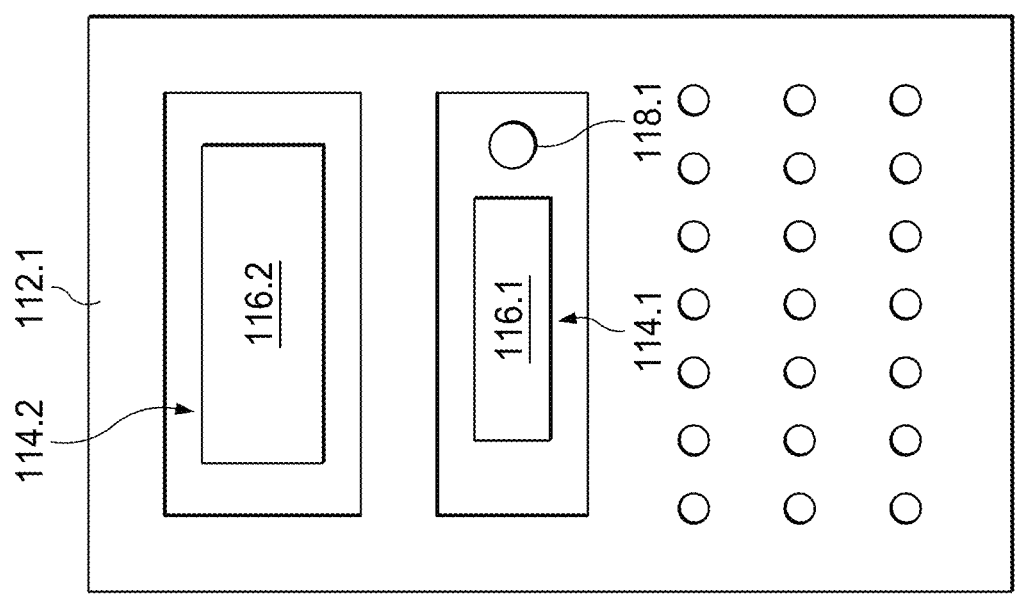
FIG. 6 illustrates a plan view of a single region shown separated from the frame of FIG. 5.

FIG. 6 illustrates a plan view of a single region 112.1, shown separated from frame 100.1 of FIG. 5, with it understood that each region 112.1 in frame 100.1 may be similarly configured as shown in FIG. 6, prior to singulating each region 112.1 from frame 100.1. In FIG. 6, one or more, with an example of one, integrated circuit is positioned within each respective aperture 114.1 and 114.2 (die 116.1 positioned within aperture 114.1; die 116.2 positioned within aperture 114.2). From the earlier illustrated figures, one skilled in the art should appreciate that the positioning of die 116.1 and 116.2 are subsequently retained by other materials and/or layers, associated with the embedded die packaging. Also in an example embodiment, a conductive member 118.1, comparable to conductive member 118 from the earlier description, is positioned within one (or both) of apertures 114.1 and 114.2, where in the example of FIG. 6 conductive member 118.1 is shown in aperture 114.1. Accordingly, when subsequent layering is formed relative to region 112.1 and die 116.1 and 116.2, conductive member 118.1 provides a potential conductive path between the two major surfaces (e.g., top and bottom in the illustrated perspective) of either die, and to which other conductive layers/vias may be coupled, in comparable fashion as shown in FIG. 4C.

Figure 7D:
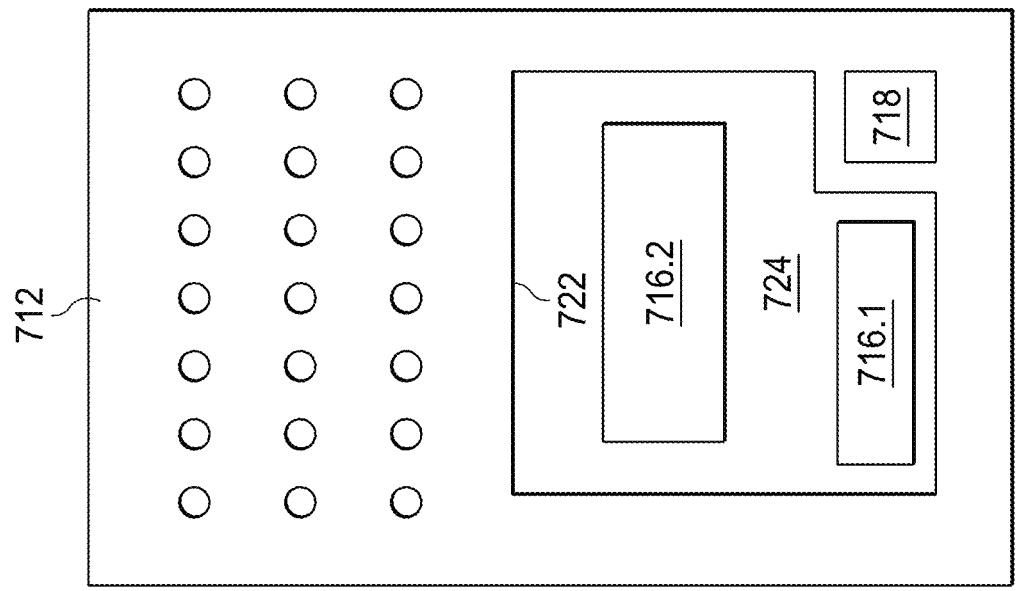
FIG. 7D illustrates a plan view of a single region shown separated from the frame of FIG. 7A and following the processing of FIGS. 7B and 7C.
Figure 7A:
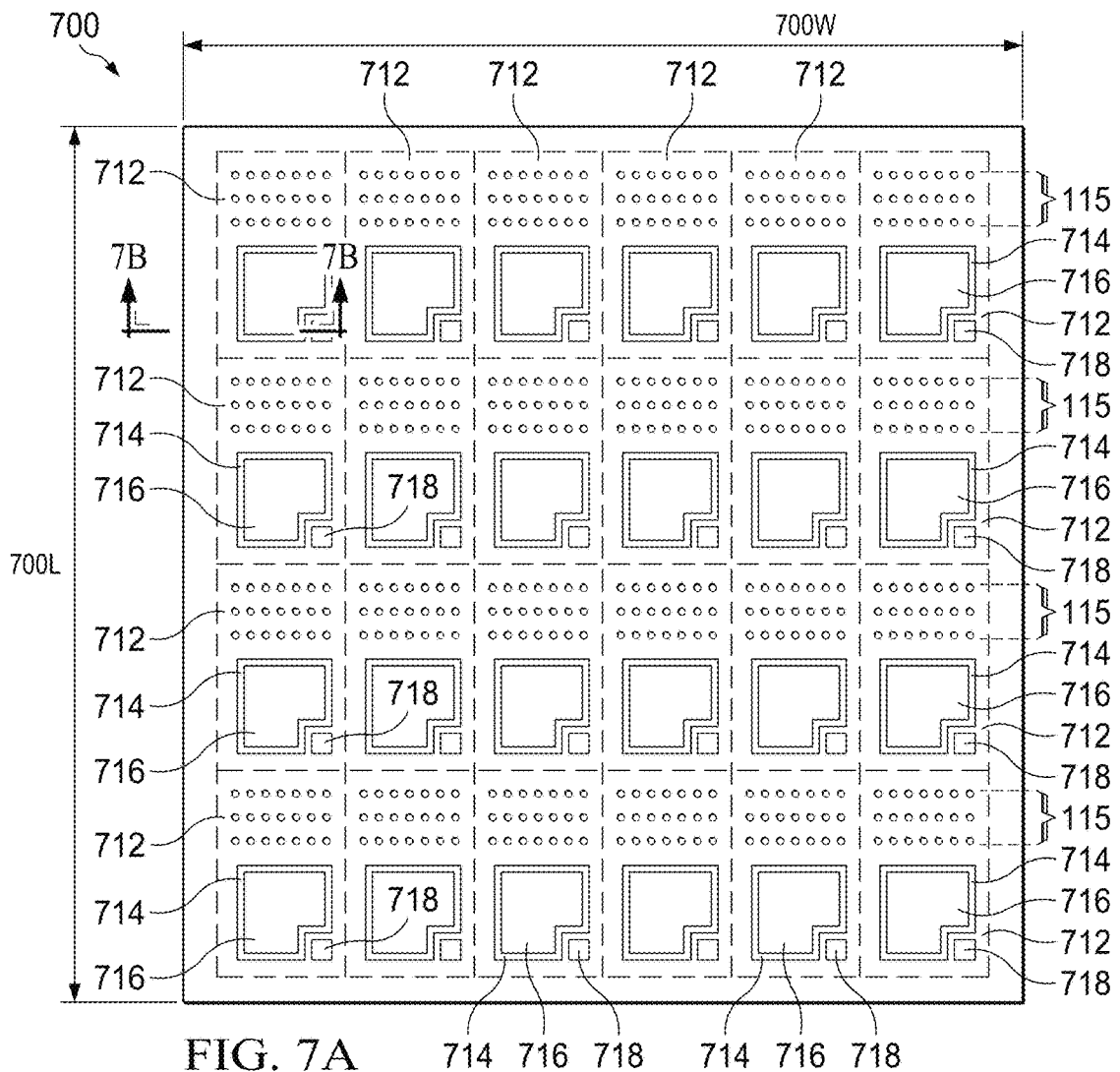
FIG. 7A illustrates a plan view.
Figure 7B:
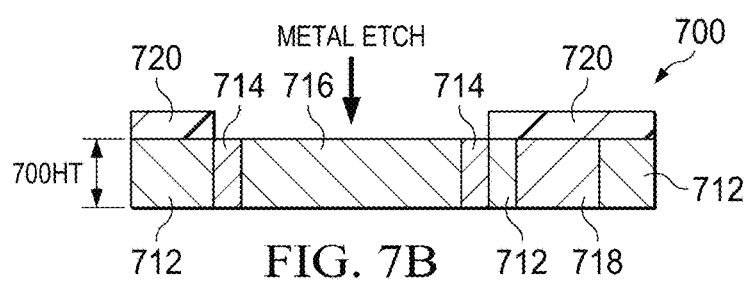
FIG. 7B illustrates a cross-sectional view, of an alternative embedded die package frame.

FIG. 7A illustrates a plan view, and FIG. 7B illustrates a cross-sectional view, of an alternative embedded die package frame 700. Frame 700 in general may have the same or comparable dimensions 700L, 700W, and 700TH to respective dimensions 100L, 100W, and 100TH, and materials, and regions 712 (comparable to 112), as frame 100 of FIG. 1. Alternatively, as compared to frame 100, for frame 700 each region 712 also may be smaller, as may be the eventual apertures formed in each such region, for example by using a chemical etch to form the apertures, as opposed to the mechanical removal described above with respect to frames 100 and 100.1. To facilitate the smaller possible dimensions and accuracy for frame 700, each of its (to be singulated) regions 712 is initially formed with two metal aspects formed through the height 700HT of frame 700, as further shown in the cross-sectional view of FIG. 7B. First, in each of regions 712, a sacrificial metal perimeter region 714 is provided, defining a respective frame material internal area 716, within the boundary defined by sacrificial metal perimeter region 714. Second, a metal conductive member 718 is provided, outside of sacrificial metal perimeter region 714. The shape of both perimeter region 714 and conductive member 718 may vary, where the example shows that the two combine to provide a generally rectangular outer region, and where conductive member 718 may have a cross sectional shape (along frame 700) that is square, which alternatively may be some other shape (e.g., circular). Lastly, note that the illustration as shown in FIG. 7A may be formed by attaching copper plate on adhesive tape and with build-up for region 714 and metal conductive member 718.

Figure 7C:
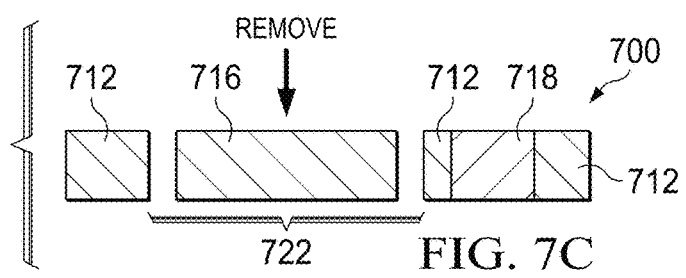
FIG. 7C illustrates FIG. 7B after additional integrated circuit packaging processing.

FIG. 7B illustrates additional items not shown in FIG. 7A, and along with the cross-sectional view of FIG. 7C, demonstrates additional processing of frame 700, prior to including it in an embedded die package. Shown in FIG. 7B, a mask 720 is added atop frame 700, with an opening aligning with perimeter region 714. Thereafter, a metal etch is performed, thereby removing the unmasked metal. Accordingly, the metal etch removes sacrificial metal perimeter region 714, as shown in FIG. 7C, and leaves an aperture boundary 722 with frame material internal area 716 remaining therein. Next, frame material internal area 716, within aperture boundary 722, is removed, for example by mechanical removal. Notably, therefore, the prior metal etch of FIG. 7B, to aperture boundary 722, can provide precision as to a smaller area than may be achieved efficiently with mechanical removal; once that metal etch is performed, it defines aperture boundary 722, from which the remaining frame material in internal area 716 may be more easily removed, having the benefit of the dimensional precision/control of the preceding etch.

FIG. 7D illustrates a plan view of a single region 712, shown separated from frame 700 of FIG. 7A, with it understood that each region 712 in frame 700 may be similarly configured as shown in FIG. 7D, prior to singulating each region 712 from frame 700. In FIG. 7D, one or more, with an example of two, integrated circuit die 716.1 and 716.2, are positioned within aperture boundary 722, where within that boundary is now existing a full aperture 724 through region 712, given the removal of frame material internal area 716 in FIG. 7C. The FIG. 7D structure may thereafter be processed, as shown in earlier illustrated figures, so that the positioning of die 716.1 and 716.2 are subsequently retained by other materials and/or layers, associated with the embedded die packaging. Also in this example embodiment, conductive member 718 is outside of aperture 724, but nevertheless is proximate aperture 724 and die 716.1 and 716.2 therein. Moreover, conductive member 718 is coplanar with those die (see, e.g., FIG. 7C) so that conductive member 718, as with comparable structures in other example embodiments described, provides a potential conductive path to one or both of the top and bottom surfaces of any die (e.g., 716.1; 716.2) in that same plane. Accordingly, conductive member 718 again provides again a conductive member, formed in advance of the embedded die packaging process, rather than using time and resources to build such a conductive path using plating or the like, during the packaging process.

Figure 8A:
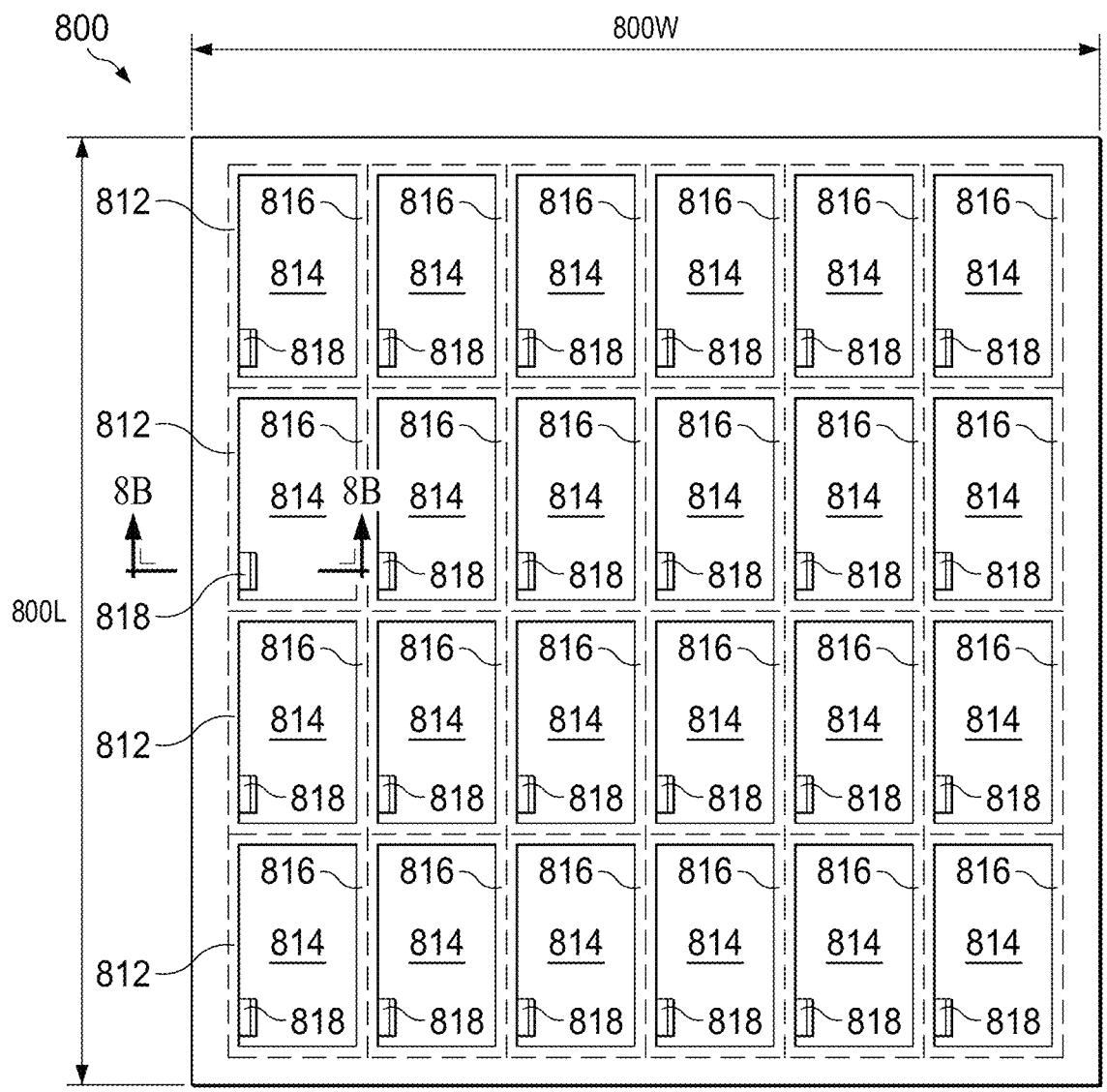
FIG. 8A illustrates a plan view.
Figure 8B:
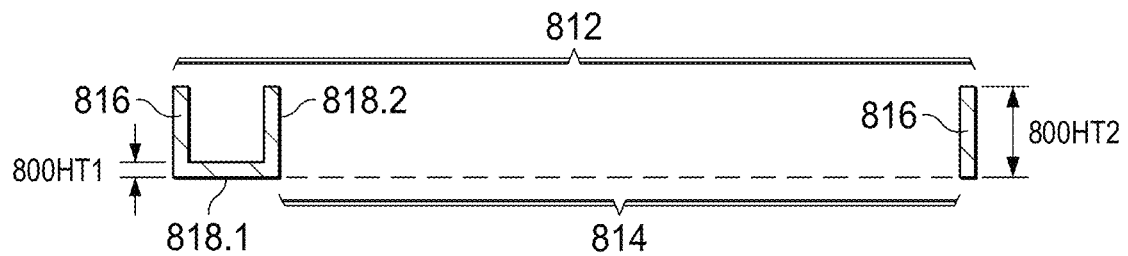
FIG. 8B illustrates a cross-sectional view, of an alternative embedded die package frame.

FIG. 8A illustrates a plan view, and FIG. 8B illustrates a cross-sectional view, of an alternative embedded die package frame 800, that again includes a number of regions 812 and is used to concurrently package a number of integrated circuit die. Specifically, one or more die are positioned within each aperture 814 of a respective region 812, and those regions 812 are later singulated from frame 800 as part of the embedded die packaging process. Frame 800 in general may have the same or comparable outer dimensions 800L and 800W as frame 100 of FIG. 1, but frame 800 also differs in other respects from earlier-described frames. First, frame 800 is preferably constructed of a conductive material, such as metal, and more particularly as copper. Second, a metal boundary 816 provides a plane that surrounds each aperture 814, and from a point along metal boundary 816 is a material extension 818 which, as perceptible in FIG. 8B, has a first portion 818.1 of height 800HT1 that extends inwardly from boundary 816 toward aperture 814 and a second portion 818.2 of height 800HT2 that extends away from an internal point of first portion 818.1, such as perpendicularly (e.g., shown as upward) within aperture 814 and generally parallel to the same height 800HT2 of metal boundary 816. Height 800HT2 may be comparable to the frame height described above (e.g., 100HT; 700HT), while height 800HT1 may be in the range of 50 µm to 150 µm. In this manner and as shown below, second portion 818.2 may be embedded to provide and function as a conductive member for a singulated package to provide a potential conductive path to one or both of the top and bottom surfaces of one or more integrated circuit die coplanar with second portion 818.2. Lastly, note that height 800HT1 as well as the vertical extension of metal boundary 9816 may be adjusted, for example to achieve desirable frame stiffness while also facilitation singulation, as further demonstrated below.

Figure 8C:
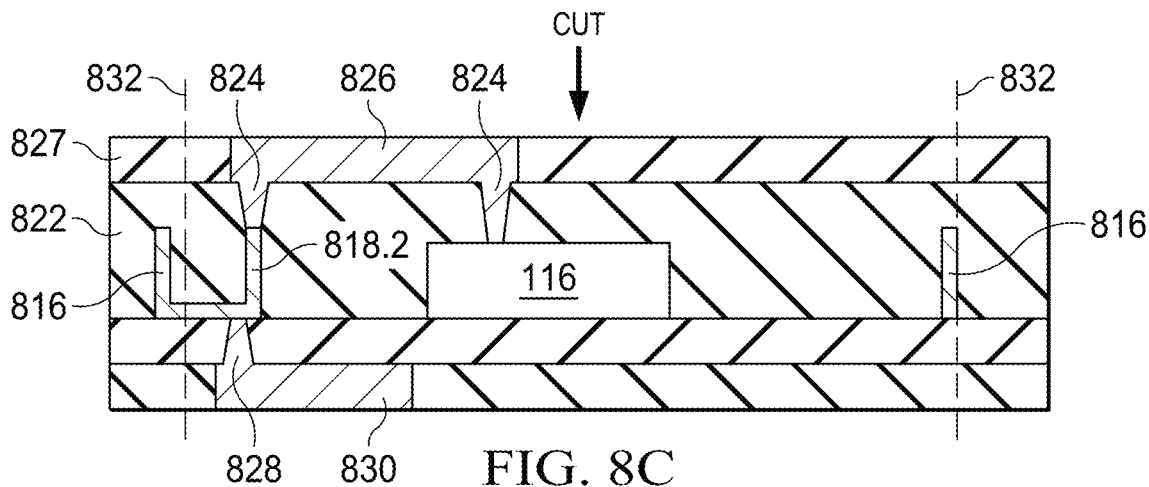
FIG. 8C illustrates FIG. 8B after additional integrated circuit packaging processing.

FIG. 8C illustrates a cross-sectional view of the frame 800 region 812 from FIG. 8B after additional embedded packaging processing. Each of the FIG. 8B structures is positioned atop a dielectric (e.g., build-up) layer 820, which may be preceded by first applying those structures to adhesive tape, which can then be replaced with dielectric layer 820. Next, one or more die 116 are positioned within aperture 814 and coplanar with metal boundary 816. Thereafter, an additional dielectric layer 822, such as air-brown-fiber, is heated and brought downwardly in contact with the remaining structure of FIG. 8B. The heat causes layer 822 to soften, to a jelly-like consistency, filling any voids between adjacent components, such as in aperture 814 and between the parts of material extension 818, with the result generally as shown in FIG. 8C. Thereafter, vias 824 are formed through an exposed surface of layer 822, such as by forming holes (which may be tapered) in layer 822 and patterning a metal layer 826 to fill those holes such that a portion of metal layer 826 remains generally planar relative to layer 822, while the metal-filled vias 824 provide a conductive path between metal layer 826 and any conductor that is contacted by vias 824 (as mentioned earlier for other vias, these vias alternatively may be formed by laser and semi-additive plating after planarizing). A filler layer 827 (e.g., dielectric) also may be formed coplanar with metal layer 826, so as to planarize a surface of the structure. Further, vias 824 provide electrical contact to an upper surface of circuit die 116 and also to material extension 818. Similar metal conduction paths may be formed on the other exposed surface of layer 822. In this regard, vias 828 are formed through that other exposed surface of layer 820, such as by forming (e.g., tapered) holes in layer 820 and patterning a metal layer 830 to fill those holes such that a portion of metal layer 830 remains generally planar below layer 820, while the metal-filled vias 828 provide a conductive path between metal layer 830 and any conductor that is contacted by vias 828. Accordingly, material extension 818 provides an electrical path to an item above die 116 and an item below it, where here that path includes vias 824 and metal layer 826, material extension 818, via 828, and metal layer 830.

Figure 8D:
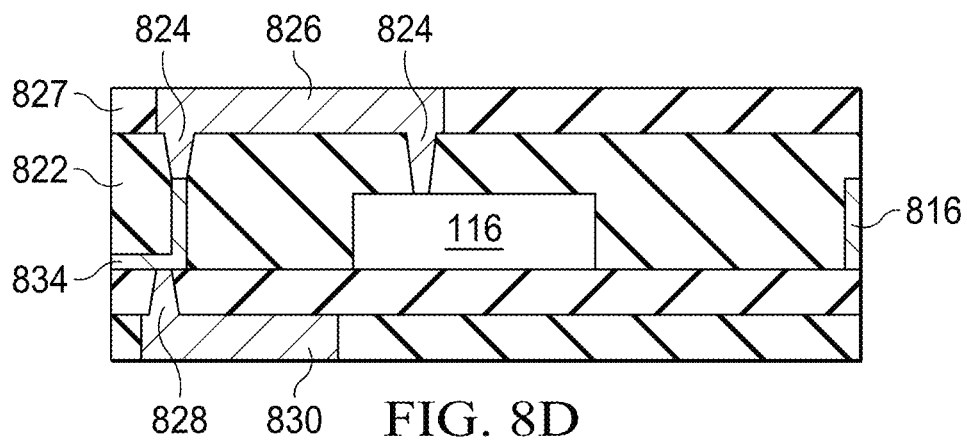
FIG. 8D illustrates FIG. 8C after additional integrated circuit packaging processing.

Additional layers may be added to those shown in FIG. 8C, providing conductive paths to other points in the package. Also as known in the art, as final layers are completed, manners of electrically connecting outside the package are also formed. For example, solder mask or the like may be used to provide pads or a comparable conductive structure, so that the package may be connected by other manners (e.g., ball grid array) to other electrical componentry. Completing FIG. 8C, dashed singulation lines 832 are shown to illustrate where, once all layers are complete, cuts may be made relative to the illustration, so as to separate the FIG. 8C layers (and any added layers thereto) into a separate integrated circuit package, resulting in the singulated package shown in cross-sectional view in FIG. 8D. Note that during singulation, the remaining singulated portions from frame 800 may be maintained in place with vacuum underneath, so each singulated unit will be held in position by vacuum hole under each unit. After singulation, individual units can be relocated (e.g., by pick-and-place into a tray). Note that the cutting of material extension 818 results in a metal boundary around the entire (or a portion) of the singulated layer as shown by dashed lines in FIG. 8A, and as shown in FIG. 8C results in a conductive stub 834, thereby providing an alternative externally-accessible electrical access point, to other points to which stub 834 is electrically connected within the resultant embedded die package.

Figure 9:
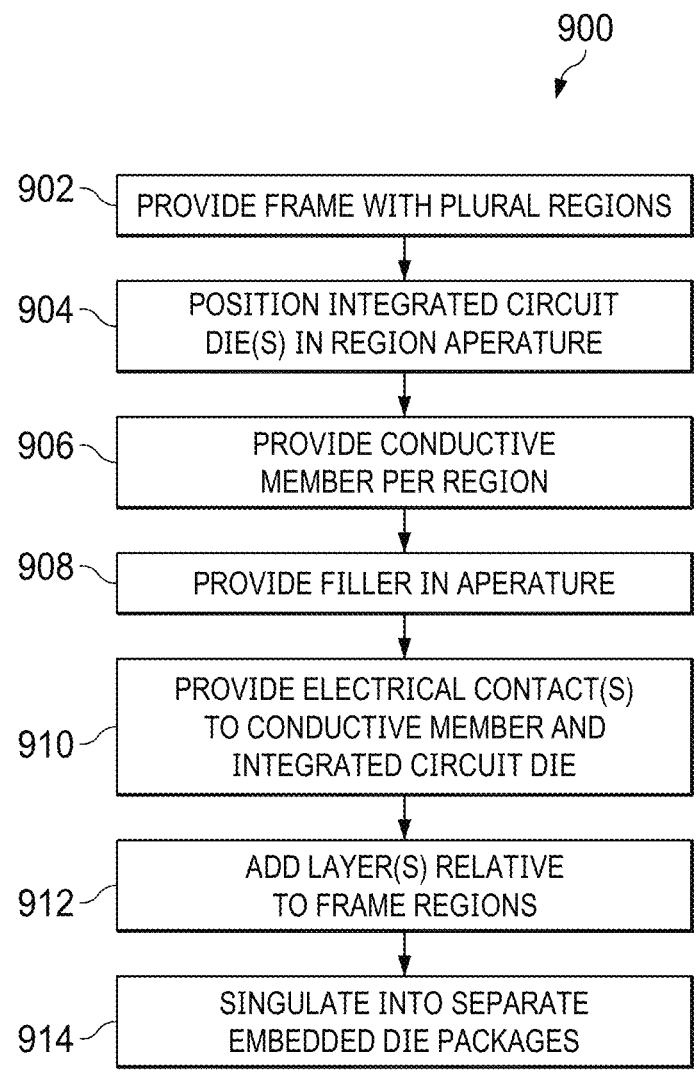
FIG. 9 illustrates a flowchart method of processing steps for fabricating an embedded die package.

FIG. 9 illustrates a flowchart method 900 of processing steps for fabricating an embedded die package according to an example embodiment. The steps of method 900 are shown in a sequence for sake of explanation, but some may be re-ordered, and other steps may be added, as part of the fabrication process. Step 902 provides a frame with a plurality of regions, each region corresponding to a respective embedded die package. Step 904 positions at least one integrated circuit die in a respective aperture in a respective region of the frame. Part of step 904 includes providing for the aperture, if it is not already in the frame—see, for example, either the mechanical and/or chemical aperture formation described above. Step 906 provides a conductive member in the boundary of the region, the conductive member having been formed prior to and apart from layer formation of the embedded die package, and having a height in an example embodiment of at least the height of the integrated circuit die positioned in an aperture. Part of step 906 includes either including the conductive member in each region as part of the frame, or positioning the conductive member in an aperture associated with each frame region. Step 908 provides filler within the aperture per region, such as a dielectric between the integrated circuit die(s) and the remainder of structure within the same layer (e.g., other portions of the frame; any conductive member(s) in the cavity). Step 910 forms, per region, an electrical contact (e.g., vias) to at least one end of the conductive member and a point on a at least one surface of the integrated circuit die. Step 912 adds one or more layers to embed the frame, including its regions, and per region, the previously-positioned integrated circuit die, the conductive member, and the electrical contact. Step 914 singulates the layers to separate the layers, and collective frame and its regions, into separate singulated embedded die packages.

From the above, one skilled in the art should appreciate that numerous example embodiments are provided of embedded die packaging. Example embodiment may have various benefits. For example, example embodiments provide efficient embedded die packaging. As another example, improved strength may be achieved in singulated packages. As still another example, conductive paths in the package may be improved with a pre-formed conductive member in the package, as opposed to use of laborious. As still another example, singulated packages produced from the teachings of this document may be more beneficial to implement switches with higher switching frequency (e.g., Gallium Nitride, Silicon carbide), but such teachings also may applied to other semiconductor technology (e.g. MOSFET, IGBT, Diode, JFET, GaAs, etc.). As a final example, additional modifications are possible in the described embodiments, and other embodiments are possible, within the scope of the claims.

What is claimed is:

1. An embedded die package, comprising:
   a layer having an exposed boundary on a surface of the embedded die package, wherein at least a portion of the exposed boundary comprises organic material;
   at least one integrated circuit die positioned in the layer and within the exposed boundary; and
   a dielectric material positioned in the layer and between the at least one integrated circuit die and a conductive member adjacent the at least one integrated circuit die, wherein a thickness of the conductive member is same as that of the integrated circuit die.

2. The embedded die package of claim 1 and further comprising a conductive member in the layer and within the exposed boundary.

3. The embedded die package of claim 2 wherein the conductive member comprises a non-plated conductive member.

4. The embedded die package of claim 3 and further comprising a dielectric material positioned in the layer and between the exposed boundary and the non-plated conductive member.

5. The embedded die package of claim 4 and further comprising a dielectric material positioned in the layer and between the at least one integrated circuit die and the non-plated conductive member.

6. The embedded die package of claim 3 and further comprising a dielectric material positioned in the layer and between the at least one integrated circuit die and the non-plated conductive member.

7. The embedded die package of claim 2 and further comprising a dielectric material positioned in the layer and between the at least one integrated circuit die and the conductive member.

8. The embedded die package of claim 1, wherein the conductive member includes copper.

9. The embedded die package of claim 2 wherein the layer comprises a first layer, and further comprising:
a first metal conductor in a first metal layer apart from the first layer, the first metal conductor electrically coupled to the conductive member; and
a second metal conductor in a second metal layer apart from the first layer, the second metal conductor electrically coupled to the conductive member.

10. The embedded die package of claim 9 wherein the first metal conductor is electrically coupled to the conductive member by a conductive-filled via.

11. The embedded die package of claim 9 wherein the first metal conductor is electrically coupled to the conductive member by a metal plated region.

12. The embedded die package of claim 2 and further comprising an organic material positioned in the layer and between the at least one integrated circuit die and the conductive member.

13. The embedded die package of claim 1 wherein the at least one integrated circuit die comprises a first integrated circuit die, and further comprising a second integrated circuit die positioned in the layer and within the exposed boundary.

14. The embedded die package of claim 13 and further comprising an organic material positioned in the layer and between the first integrated circuit die and the second integrated circuit die.

15. The embedded die package of claim 1 wherein the at least one integrated circuit die comprises one of gallium nitride or silicon carbide.

16. The embedded die package of claim 1 wherein the entire exposed boundary comprises organic material.

17. An embedded die package, comprising:
a layer having an exposed boundary on a surface of the embedded die package, wherein at least a portion of the exposed boundary comprises metal;
at least one integrated circuit die aligned to the layer and within the exposed boundary; and
a dielectric material positioned in the layer and between the at least one integrated circuit die and a structure adjacent the at least one integrated circuit die, wherein top and bottom surfaces of the structure are coplanar with top and bottom surfaces of the integrated circuit die.

18. The embedded die package of claim 17 wherein the layer provides a plane, wherein the layer comprises a conductive portion within the boundary and having a portion extending in a direction away from the plane.

19. The embedded die package of claim 18 and further comprising a dielectric material positioned between the at least one integrated circuit die and the conductive portion.

20. The embedded die package of claim 18 wherein the layer comprises a first metal layer, and further comprising:
a first metal conductor in a second metal layer apart from the first metal layer, the first metal conductor electrically coupled to the conductive portion; and
a second metal conductor in a third metal layer apart from the first metal layer, the second metal conductor electrically coupled to the conductive portion.

21. The embedded die package of claim 20 wherein the first metal conductor is electrically coupled to the conductive portion by a conductive-filled via.

22. The embedded die package of claim 17 wherein the at least one integrated circuit die comprises a first integrated circuit die, and further comprising a second integrated circuit die aligned to the layer and within the exposed boundary.

23. The embedded die package of claim 17 wherein the layer provides a plane, wherein the layer comprises a conductive portion within the boundary and having a portion extending perpendicularly from the plane.

* * * * *